United States Patent
Hirose et al.

(10) Patent No.: US 8,988,938 B2
(45) Date of Patent: *Mar. 24, 2015

(54) METHOD TO REDUCE PROGRAM DISTURBS IN NON-VOLATILE MEMORY CELLS

(71) Applicant: Cypress Semiconductor Corporation, San Jose, CA (US)

(72) Inventors: Ryan T. Hirose, Colorado Springs, CO (US); Igor G. Kouznetsov, San Francisco, CA (US); Venkatraman Prabhakar, Pleasanton, CA (US); Kaveh Shakeri, Campbell, CA (US); Bogdan I. Georgescu, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/216,589

(22) Filed: Mar. 17, 2014

(65) Prior Publication Data

US 2014/0301139 A1    Oct. 9, 2014

Related U.S. Application Data

(63) Continuation of application No. 13/920,352, filed on Jun. 18, 2013, now Pat. No. 8,675,405.

(60) Provisional application No. 61/778,136, filed on Mar. 12, 2013.

(51) Int. Cl.
  *G11C 11/34* (2006.01)
  *G11C 16/34* (2006.01)

(52) U.S. Cl.
  CPC ............ *G11C 16/3427* (2013.01); *G11C 11/34* (2013.01)

USPC ............ 365/185.02; 365/185.17; 365/185.16; 365/185.18; 365/185.24

(58) Field of Classification Search
  CPC ........................... G11C 16/3427; G11C 11/34
  USPC ............ 365/185.02, 185.16, 185.17, 185.18, 365/185.24

See application file for complete search history.

(56) References Cited

U.S. PATENT DOCUMENTS 5,621,690 A * 4/1997 Jungroth et al. ............... 365/200
5,663,923 A   9/1997 Baltar et al.

(Continued)

OTHER PUBLICATIONS

U.S. Appl. No. 13/920,352: "Method to Reduce Program Disturbs in Non-Volatile Memory Cells" Bogdan Georgescu et al., filed Jun. 18, 2013; 33 pages.

(Continued)

*Primary Examiner* — Viet Q Nguyen
(74) *Attorney, Agent, or Firm* — Lowenstein Sandler LLP

(57) ABSTRACT

A non-volatile memory and methods of operating the same to reduce disturbs is provided. In one embodiment, the method includes coupling a first positive high voltage to a first global wordline in a first row of an array of memory cells, and coupling a second negative high voltage ($V_{NEG}$) to a first bitline in a first column of the array to apply a bias to a non-volatile memory transistor in a selected memory cell to program the selected memory cell. A margin voltage having a magnitude less than VNEG is coupled to a second global wordline in a second row of the array, and an inhibit voltage coupled to a second bitline in a second column of the array to reduce a bias applied to a non-volatile memory transistor in an unselected memory cell to reduce program disturb of data programmed in the unselected memory cell due to programming.

20 Claims, 8 Drawing Sheets

(56) References Cited

U.S. PATENT DOCUMENTS

| | | | | |
|---|---|---|---|---|
| 5,886,923 A * | 3/1999 | Hung | ........................ | 365/185.11 |
| 5,896,340 A * | 4/1999 | Wong et al. | .............. | 365/230.03 |
| 6,061,270 A | 5/2000 | Choi | | |
| 6,181,599 B1 | 1/2001 | Gongwer | | |
| 6,212,099 B1 * | 4/2001 | Zhang et al. | .............. | 365/185.11 |
| 6,620,682 B1 * | 9/2003 | Lee et al. | ....................... | 438/257 |
| 6,707,718 B1 | 3/2004 | Halim et al. | | |
| 7,006,381 B2 * | 2/2006 | Dormans et al. | ........... | 365/185.28 |
| 7,046,550 B1 * | 5/2006 | Reohr et al. | .............. | 365/185.13 |
| 7,072,215 B2 * | 7/2006 | Chih | ........................ | 365/185.14 |
| 7,324,387 B1 * | 1/2008 | Bergemont et al. | ....... | 365/185.33 |
| 7,433,241 B2 | 10/2008 | Dong et al. | | |
| 7,463,531 B2 | 12/2008 | Hemink et al. | | |
| 8,120,966 B2 * | 2/2012 | Lee | ........................ | 365/185.22 |
| 8,125,835 B2 * | 2/2012 | Hirose et al. | .............. | 365/185.29 |
| 8,243,522 B2 | 8/2012 | Bicksler | | |
| 8,274,831 B2 | 9/2012 | Mokhlesi et al. | | |
| 8,325,521 B2 * | 12/2012 | Hsieh et al. | ............... | 365/185.05 |
| 8,363,466 B2 | 1/2013 | Shinozaki et al. | | |
| 8,675,405 B1 * | 3/2014 | Georgescu et al. | ....... | 365/185.02 |
| 2006/0152248 A1 | 7/2006 | Madurawe | | |
| 2008/0144386 A1 | 6/2008 | Ng et al. | | |
| 2011/0235409 A1 | 9/2011 | Kang et al. | | |
| 2012/0091462 A1 | 4/2012 | Fumitake | | |
| 2012/0250414 A1 | 10/2012 | Khandelwal et al. | | |
| 2013/0033934 A1 | 2/2013 | Strenz et al. | | |

OTHER PUBLICATIONS

International Search Report for International Application No. PCT/US2014/011606 dated Jun. 11, 2014; 2 pages.

USPTO Notice of Allowance for U.S. Appl. No. 13/920,352 dated Oct. 30, 2013; 10 pages.

USPTO Requirement for Restriction for U.S. Appl. No. 13/920,352 dated Aug. 28, 2013; 6 pages.

Written Opinion of the International Searching Authority for International Application No. PCT/US2014/011606 mailed Jun. 11, 2014; 7 pages.

* cited by examiner

METHOD TO REDUCE PROGRAM DISTURBS IN NON-VOLATILE MEMORY CELLS

CROSS-REFERENCE TO RELATED APPLICATIONS

This application is a continuation of U.S. application Ser. No. 13/920,352, filed Jun. 18, 2013, which claims priority to U.S. Provisional Patent Application No. 61/778,136, filed Mar. 12, 2013, all of which are incorporated by reference herein in their entirety

TECHNICAL FIELD

The present disclosure relates generally to memory devices, and more particularly to methods for reducing program disturbs in non-volatile memory cells.

BACKGROUND

Non-volatile memories are widely used for storing data in computer systems, and typically include a memory array with a large number of memory cells arranged in rows and columns. Each of the memory cells includes a non-volatile charge trapping gate field-effect transistor that is programmed or erased by applying a voltage of the proper polarity, magnitude and duration between a control gate and the substrate. A positive gate-to-substrate voltage causes electrons to tunnel from the channel to a charge-trapping dielectric layer raising a threshold voltage ($V_T$) of the transistor, and a negative gate-to-channel voltage causes holes to tunnel from the channel to the charge-trapping dielectric layer lowering the threshold voltage.

Non-volatile memories suffer from program or bitline disturbs, which is an unintended and detrimental change in memory cell $V_T$ when another memory cell connected to the same bitline is inhibited from being programmed. Bitline disturb refers to disturb of the memory cells located in a row different from the row containing the cell undergoing programming. Bitline disturb occurring in the deselected row increases as the number of erase/program cycles in rows selected in the common well increases. The magnitude of bitline disturb also increases at higher temperatures, and, since memory cell dimensions scale down faster than applied voltages at advanced technology nodes, bitline disturb also becomes worse as the density of non-volatile memories increase.

It is, therefore, an object of the present invention to provide improved non-volatile memories and methods of programming the same.

BRIEF DESCRIPTION OF THE DRAWINGS

The present invention will be understood more fully from the detailed description that follows and from the accompanying drawings and the appended claims provided below, where:

DETAILED DESCRIPTION

Methods for reducing program disturbs in non-volatile memories are described herein. The method is particularly useful for operating memories made of memory arrays of bit cells or memory cells including non-volatile trapped-charge semiconductor devices that may be programmed or erased by applying a voltage of the proper polarity, magnitude and duration.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components The non-volatile memory may include memory cells with a non-volatile memory transistor or device implemented using Silicon-Oxide-Nitride-Oxide-Silicon (SONOS) or floating gate technology.

Figure 1:
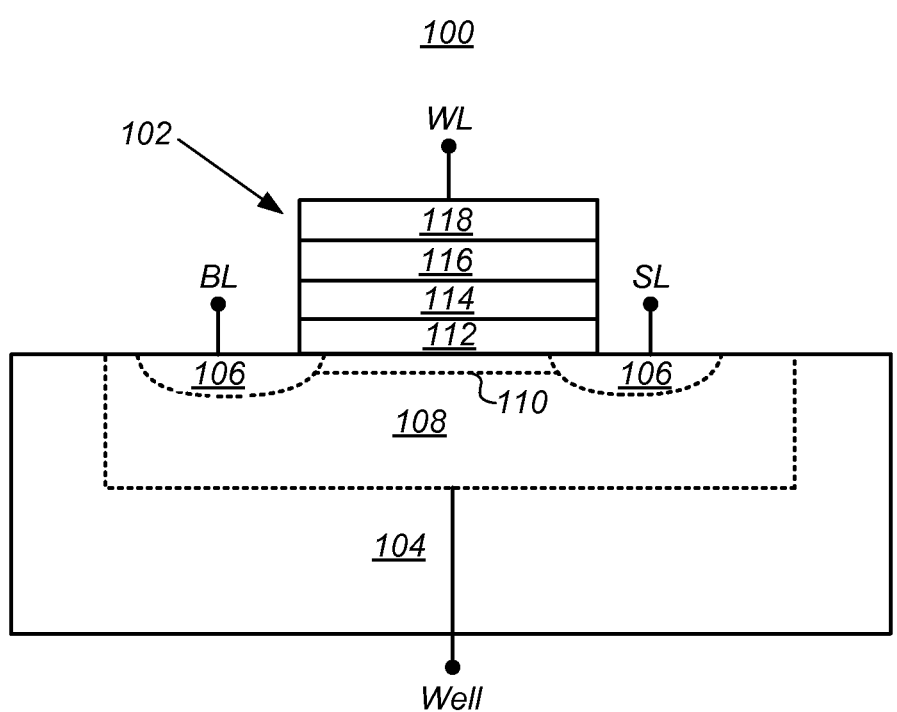
FIG. 1 is a block diagram illustrating a cross-sectional side view of a non-volatile memory transistor or device.

In one embodiment, illustrated in FIG. 1, the non-volatile memory transistor or device is a SONOS-type non-volatile memory device. Referring to FIG. 1, a SONOS device 100 includes a gate stack 102 formed over a substrate 104. The SONOS device 100 further includes source/drain regions 106 formed in a well 108 in the substrate 104 on either side of gate stack 102, which define a channel region 110 underneath gate stack. Gate stack 102 includes an oxide tunnel dielectric layer 112, a nitride or oxynitride charge-trapping layer 114, a top, blocking oxide layer 116 and a poly-silicon (poly) or metal layer which serves as a control gate 118.

When the control gate 118 is appropriately biased, electrons from the source/drain regions 106 are injected or tunnel through tunnel dielectric layer 112 and are trapped in the charge-trapping layer 114. The mechanisms by which charge is injected can include both Fowler-Nordheim (FN) tunneling and hot-carrier injection. The charge trapped in the charge-trapping layer 114 results in an energy barrier between the drain and the source, raising the threshold voltage $V_T$ necessary to turn on the SONOS device 100 putting the device in a "programmed" state. The SONOS device 100 can be "erased" or the trapped charge removed and replaced with holes by applying an opposite bias on the control gate 118.

In another embodiment, the non-volatile trapped-charge semiconductor device can be a floating-gate MOS field-effect transistor (FGMOS) or device. Generally, is similar in structure to the SONOS device 100 described above, differing primarily in that a FGMOS includes a poly-silicon (poly) floating gate, which is capacitively coupled to inputs of the device, rather than a nitride or oxynitride charge-trapping. Thus, the FGMOS device can be described with reference to FIG. 1. Referring to FIG. 1, a FGMOS device 100 includes a gate stack 102 formed over a substrate 104. The FGMOS device 100 further includes source/drain regions 106 formed in a well 108 in the substrate 104 on either side of gate stack 102, which define a channel region 110 underneath gate stack. Gate stack 102 includes a tunnel dielectric layer 112, a floating gate layer 114, a blocking oxide or top dielectric layer 116 and a poly-silicon or metal layer which serves as a control gate 118.

Similarly to the SONOS device described above the FGMOS device 100 can be programmed by applying an appropriate bias between the control gate and the source and drain regions to inject charge in to the charge-trapping layer, raising the threshold voltage $V_T$ necessary to turn on the FGMOS device. The FGMOS device can be erased or the trapped charge removed by applying an opposite bias on the control gate.

A memory array is constructed by fabricating a grid of memory cells arranged in rows and columns and connected by a number of horizontal and vertical control lines to peripheral circuitry such as address decoders and sense amplifiers. Each memory cell includes at least one non-volatile trapped-charge semiconductor device, such as those described above, and may have a one transistor (1T) or two transistor (2T) architecture.

Figure 2:
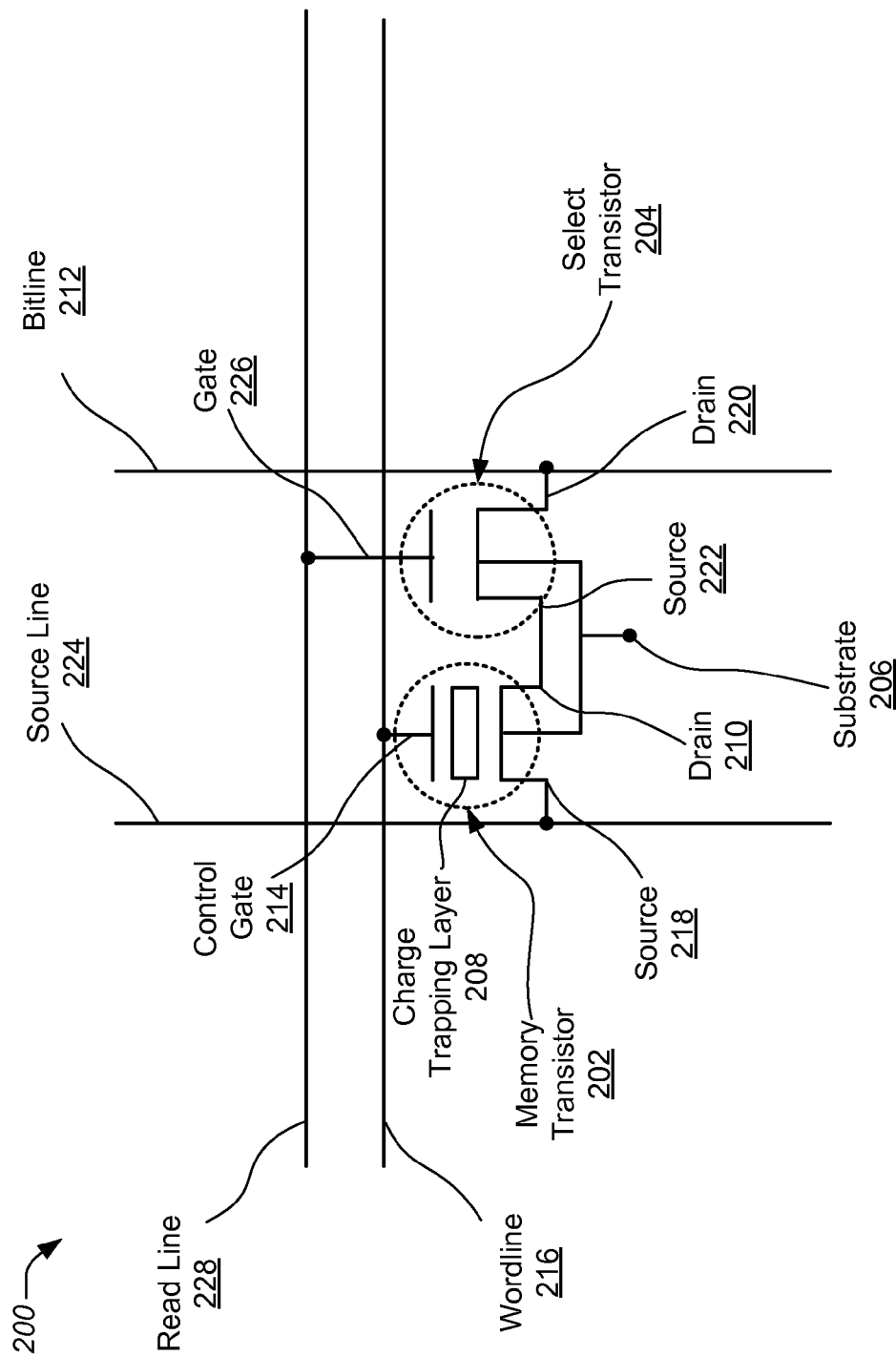
FIG. 2 is a schematic diagram illustrating a two transistor (2T) memory cell for which an embodiment of the present disclosure is particularly useful.

In one embodiment, illustrated in FIG. 2, the memory cell 200 has a 2T-architecture and includes, in addition to a non-volatile memory transistor 202, a pass or select transistor 204, for example, a conventional IGFET sharing a common substrate connection 206 with the memory transistor 202. Referring to FIG. 2, the memory transistor 202 has a charge trapping layer 208 and a drain 210 connected to a source 222 of the select transistor 204 and through the select transistor to a bitline 212, a control gate 214 connected to a wordline 216 and a source 218 connected to a source line 224. Select transistor 204 also includes a drain 220 connected to a bitline 212 and a gate 226 connected to a select or read line 228.

During an erase operation to erase the memory cell 200 a negative high voltage ($V_{NEG}$) is applied to the wordline 216 and a positive high voltage ($V_{POS}$) applied to the bitline and the substrate connection 206. Generally, the memory cell 200 is erased as part of a bulk erase operation in which all memory cells in a selected row of a memory array are erased at once prior to a program operation to program the memory cell 200 by applying the appropriate voltages to a global wordline (GWL) shared by all memory cells in the row, the substrate connection and to all bitlines in the memory array.

During the program operation the voltages applied to the wordline 216 and the bitline 212 are reversed, with $V_{POS}$ applied to the wordline and $V_{NEG}$ applied to the bitline, to apply a bias to program the memory transistor 202. The substrate connection 206 or connection to the well in which the memory transistor 202 is formed is coupled to electrical ground, $V_{NEG}$ or to a voltage between ground and $V_{NEG}$. The read or select line 228 is likewise coupled to electrical ground (0V), and the source line 224 may be at equipotential with the bitline 212, i.e., coupled to $V_{NEG}$, or allowed to float.

After an erase operation or program operation is completed, the state of the memory cell 200 can be read by setting a gate-to-source voltage ($V_{GS}$) of the memory transistor 202 to zero, applying a small voltage between the drain terminal 210 and source terminal 218, and sensing a current that flows through the memory transistor. In the programmed state, an N-type SONOS memory transistor, for example, will be OFF because $V_{GS}$ will be below the programmed threshold voltage $V_{TP}$. In the erased state, the N-type memory transistor will be ON because the $V_{GS}$ will be above an erased threshold voltage $V_{TE}$. Conventionally, the ON state is associated with a logical "0" and the OFF state is associated with a logical "1."

A memory array of memory cells and methods of operating the same to reduce disturbs will now be described with reference to FIG. 3 and Table I below. In the following description, for clarity and ease of explanation, it is assumed that all of the transistors in memory array are N-type SONOS transistors. It should be appreciated, without loss of generality that a P-type configuration can be described by reversing the polarity of the applied voltages, and that such a configuration is within the contemplated embodiments of the invention. In addition, the voltages used in the following description are selected for ease of explanation and represent only one exemplary embodiment of the invention. Other voltages may be employed in different embodiments of the invention.

Figure 3:
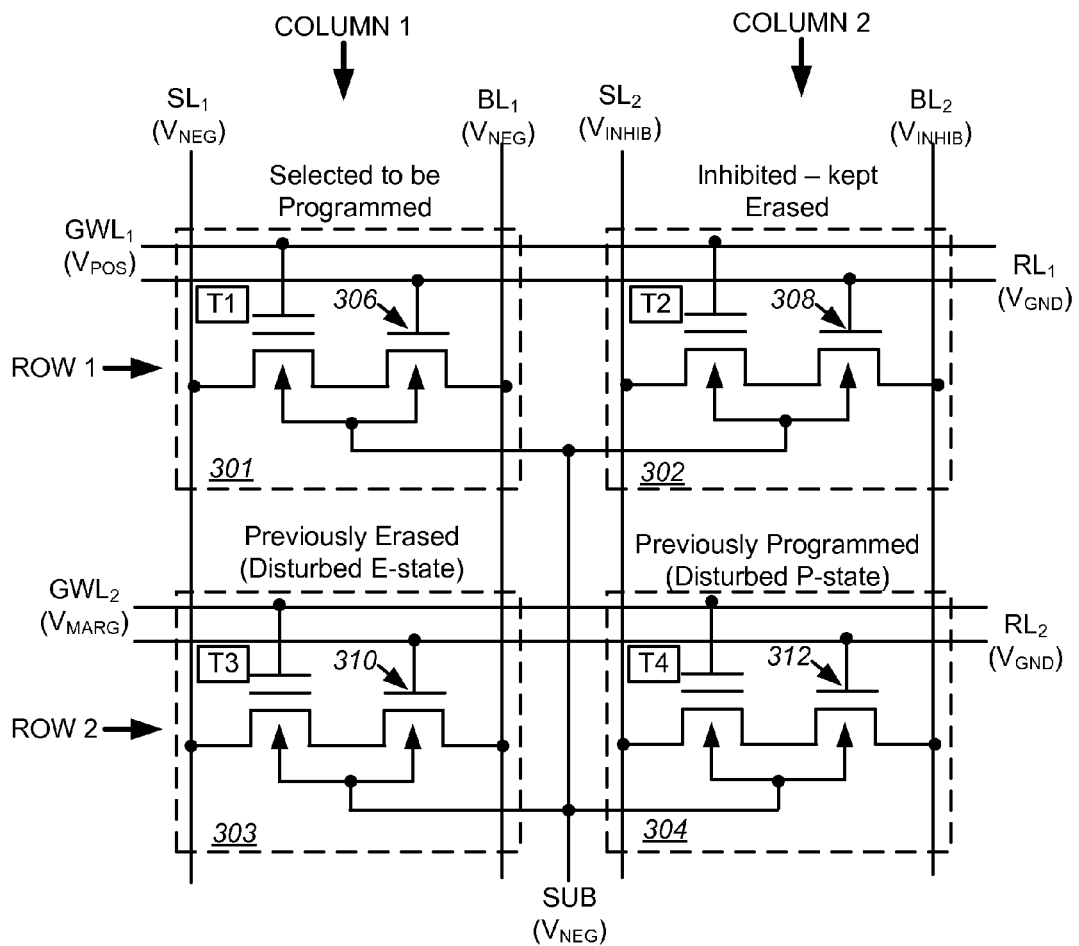
FIG. 3 is a schematic diagram is a segment of a memory array illustrating an embodiment of a program operation according to the present disclosure.

FIG. 3 illustrates an exemplary embodiment of a segment of a memory array 300, which may be part of a large memory array of memory cells. In FIG. 3, memory array 300 includes four memory cells 301, 302, 303 and 304 arranged in two rows (ROW 1, ROW 2) and two columns (COLUMN 1, COLUMN 2). Each of the memory cells 301-304 may be structurally equivalent to memory cell 200 described above.

Referring to FIG. 3, memory cell 301 is the targeted cell to be programmed to a logic "1" state (i.e., programmed to an ON state) while memory cell 302, already erased to a logic "0" state by a preceding erase operation, is maintained in a logic "0" or OFF state. These two objectives (programming cell 301 and inhibiting cell 302) are accomplished by applying a first or positive high voltage ($V_{POS}$) to a first global wordline ($GWL_1$) in the first row of the memory array 300, a second or negative high voltage ($V_{NEG}$), is applied to a first bitline ($BL_1$) to bias transistor T1 on programming the selected memory cell 301, while an inhibit voltage ($V_{Inhib}$) is applied to a second bitline ($BL_2$) to bias transistor T2 off on inhibiting programming of the deselected memory cell 302, and a common or shared voltage is applied to the substrate nodes (SUB) of all memory cells 301, 302, 303 and 304, and the read lines (RL1 and RL2) coupled to electrical ground (0V). The source lines (SL1 and SL2) may be at equipotential with the bitlines in their respective columns, i.e., SL1 is coupled to $V_{NEG}$ and SL2 coupled to the $V_{Inhib}$, or allowed to float.

In addition, and as described in greater detail below, a selected margin voltage ($V_{MARG}$) having a voltage level or magnitude less than $V_{NEG}$ is applied to a second global wordline ($GWL_2$) in the second row of the memory array 300 to reduce or substantially eliminate program-state bitline disturb in the deselected memory cell 304 due to programming of the selected memory cell 301.

Table I depicts exemplary bias voltages that may be used for programming a non-volatile memory having a 2T-architecture and including memory cells with N-type SONOS transistors.

TABLE I

| GWL1 | BL1 | SL1 | RL1 | Substrate Node | GWL2 | BL2 | SL2 | RL2 |
|---|---|---|---|---|---|---|---|---|
| $V_{POS}$ +4.7 V | $V_{NEG}$ -3.6 V | Float/ -3.6 V | $V_{GND}$ 0.0 V | $V_{NEG}$ -3.6 V | $V_{Marg}$ -2.6 V | $V_{Inhib}$ +1.2 V | Float/ +1.2 V | $V_{GND}$ 0.0 V |

Because the voltage applied to the second global wordline (GWL2) has a lower voltage level or magnitude that $V_{NEG}$, which is conventionally applied to wordlines in deselected row or cells, the gate to drain voltage ($V_{GD}$) across transistor T4 is 3.8V, as compared to a $V_{GD}$ in conventionally operated memories of 4.8V, the amount of bitline disturb of the threshold $V_T$ of T4 is reduced significantly. In one embodiment of this invention it was observed to be reduced from about 60 mV to less than about 7 mV.

The margin voltage ($V_{MARG}$) can be generated using dedicated circuitry in the memory (not shown in this figure) used solely for generating $V_{MARG}$, or can be generated using circuitry already included in the memory device. Generally, the margin voltage ($V_{MARG}$) has the same polarity as the second or $V_{NEG}$ high voltage, but is higher or more positive than $V_{NEG}$ by a voltage equal to at least the threshold voltage ($V_T$) of the transistor T4 in the memory cell 304 for which program state bitline disturb is reduced. Optionally, the circuitry used to generate the margin voltage ($V_{MARG}$) is programmable to set a desired margin voltage ($V_{MARG}$) with steps, in one embodiment, of 14 mV or less.

In one embodiment, the circuitry used to generate the margin voltage ($V_{MARG}$) includes a digital-to-analog-converter (DAC) enabled by command and control circuitry in the memory programmed to generate a margin voltage ($V_{MARG}$) of a desired magnitude or voltage level to be coupled to the GWLs of deselected row(s) during the program operation. In one particular advantageous embodiment the DAC is a margin mode DAC in the memory, which is used during initialization of the memory to adjust voltages therein, and which is not normally enabled during the program operation. Significant advantages of this embodiment include that $V_{MARG}$ can be trimmed using the (MDAC) bits, it does not represent a large load on a negative pump for $V_{NEG}$ and an output buffer of the margin mode DAC offers a low impedance driver for the $V_{MARG}$ signal. Adapting such a margin mode DAC for generating $V_{MARG}$ during the program operation requires forming an electrical connection to the GWLs of deselected rows of the memory array 300 during the program operation, and enabling the margin mode DAC through a DAC enable signal.

In certain embodiments, further adaption of the $V_{MARG}$ circuit is desirable to overcome the fact that $V_{MARG}$ was not originally designed to drive large capacitive loads active during program. One method of overcoming this limitation will now be described with reference to the graphs of FIGS. 4 and 5.

Figure 4:
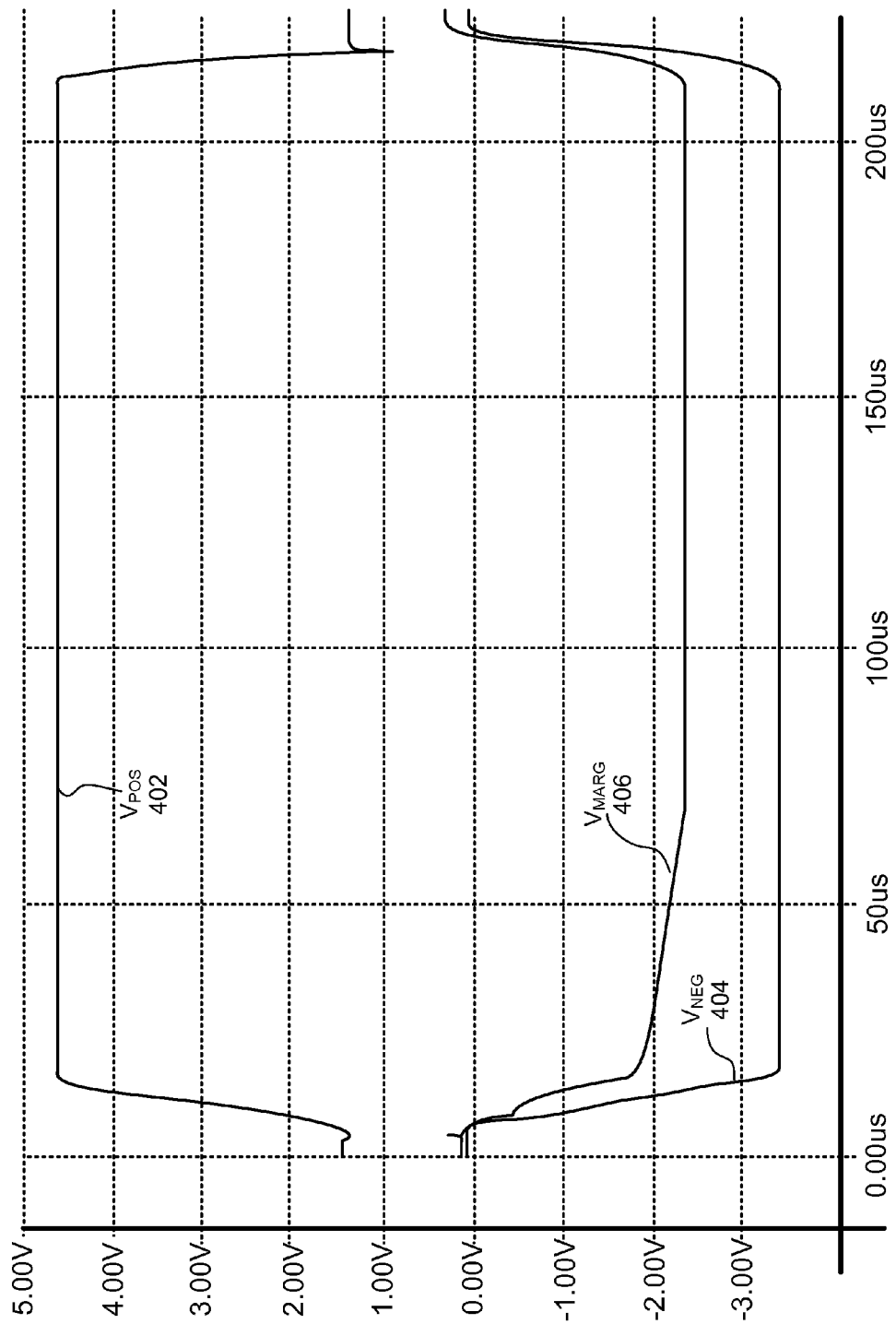
FIG. 4 is a graph illustrating a positive high voltage ($V_{POS}$), a negative high voltage ($V_{NEG}$), and an intermediate, margin voltage ($V_{MARG}$) according to an embodiment of the present disclosure.

FIG. 4 is a graph illustrating a positive first high voltage ($V_{POS}$ 402), a negative second high voltage ($V_{NEG}$ 404), and an intermediate, margin voltage ($V_{MARG}$ 406) according to an embodiment of the present disclosure. Referring to FIG. 4 it is noted that the start-up time for the circuit generating the margin voltage ($V_{MARG}$ 406) can be relatively slow, up to 80-110 µs, as compared to the second high voltage ($V_{NEG}$ 404). During this time the voltage difference between a deselected global wordline (GWL$_2$) to which the margin voltage ($V_{MARG}$ 406) is applied and the p-well (SPW) or substrate node to which second high voltage ($V_{NEG}$ 404), can reach 1.6-1.7 volts for 20-40 µs. Thus, to reduce erase-state bitline disturb in an unselected memory cell in the first column and second row of the memory array (e.g., cell T3), $V_{NEG}$ is coupled to the second global wordline (GWL$_2$) in the deselected row for up to about 40 µs until a capacitance associated with the deselected wordline(s) is sufficiently pre-charged, and $V_{NEG}$ has reached a value close to -2.0 volts. The margin voltage is then coupled to the global wordline (GWL$_2$) in the deselected row for the remainder of the program operation to reduce program-state bitline disturb in a second unselected memory cell in the second column and second row of the memory array due to programming of the selected memory cell.

Figure 5:
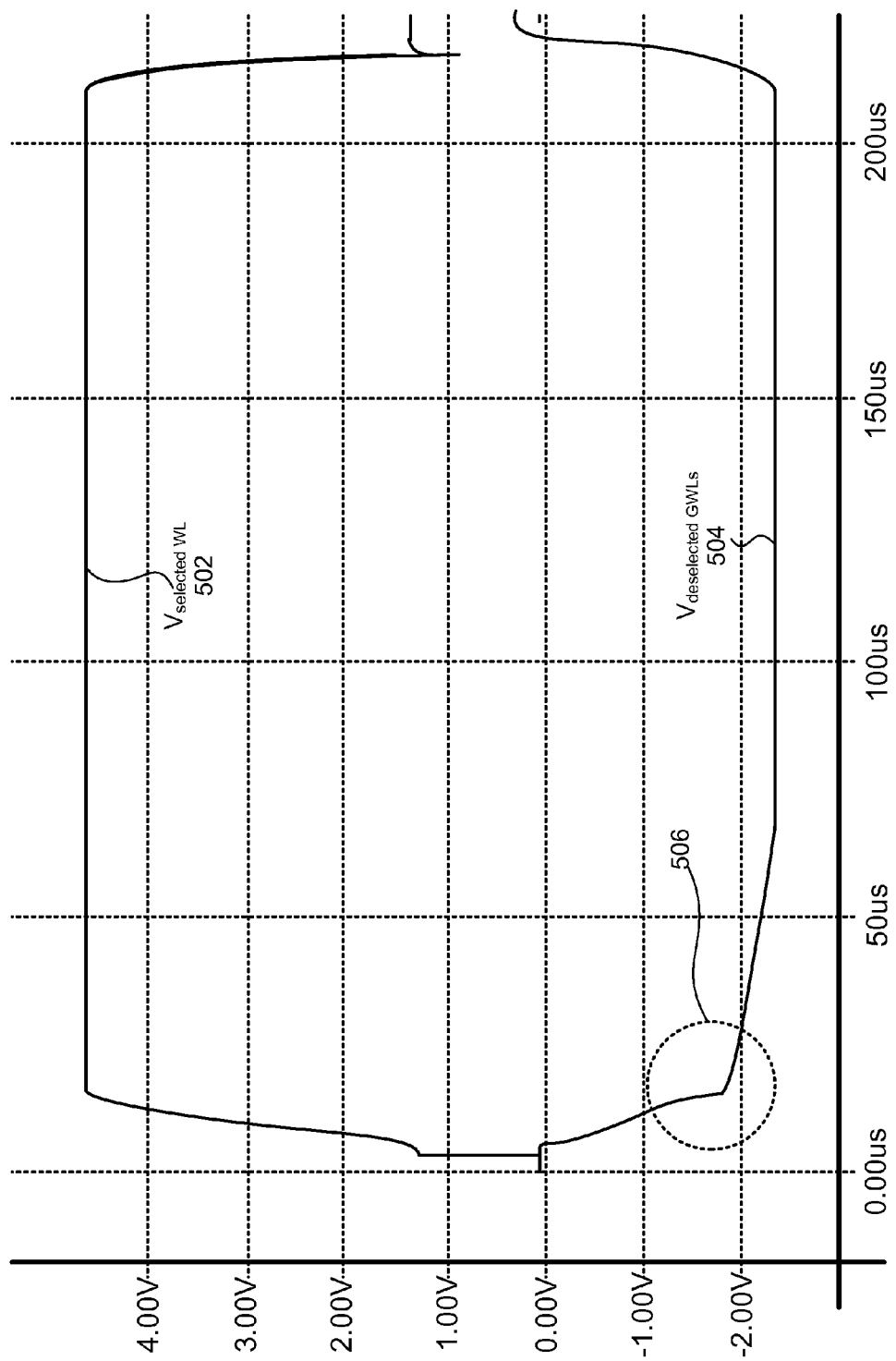
FIG. 5 is a graph illustrating voltages applied to a selected global wordline ($V_{SELECTED\ WL}$) and a deselected global wordline ($V_{DESELECTED\ GWL}$) during a program operation according to an embodiment of the present disclosure.

A graph illustrating voltages applied to a selected global wordline ($V_{SELECTED\ WL}$ 502) and a deselected global wordline ($V_{DESELECTED\ GWL}$ 504) during a program operation according to an embodiment of the present disclosure is shown in FIG. 5. Referring to FIG. 5 it is noted from the graph of the deselected global wordline voltage ($V_{DESELECTED\ GWL}$ 504) that at about 15 µs, indicated by reference numeral 506 on the graph of the deselected global wordline voltage, the global wordline (GWL$_2$) in the deselected row is switched from being coupled to second high voltage ($V_{NEG}$ 404), to being coupled to the margin voltage ($V_{MARG}$ 406) for the remainder of the program operation.

A processing system 600 to reduce bitline program disturbs according to an embodiment of the present disclosure will now be described with reference to FIG. 6.

Figure 6:
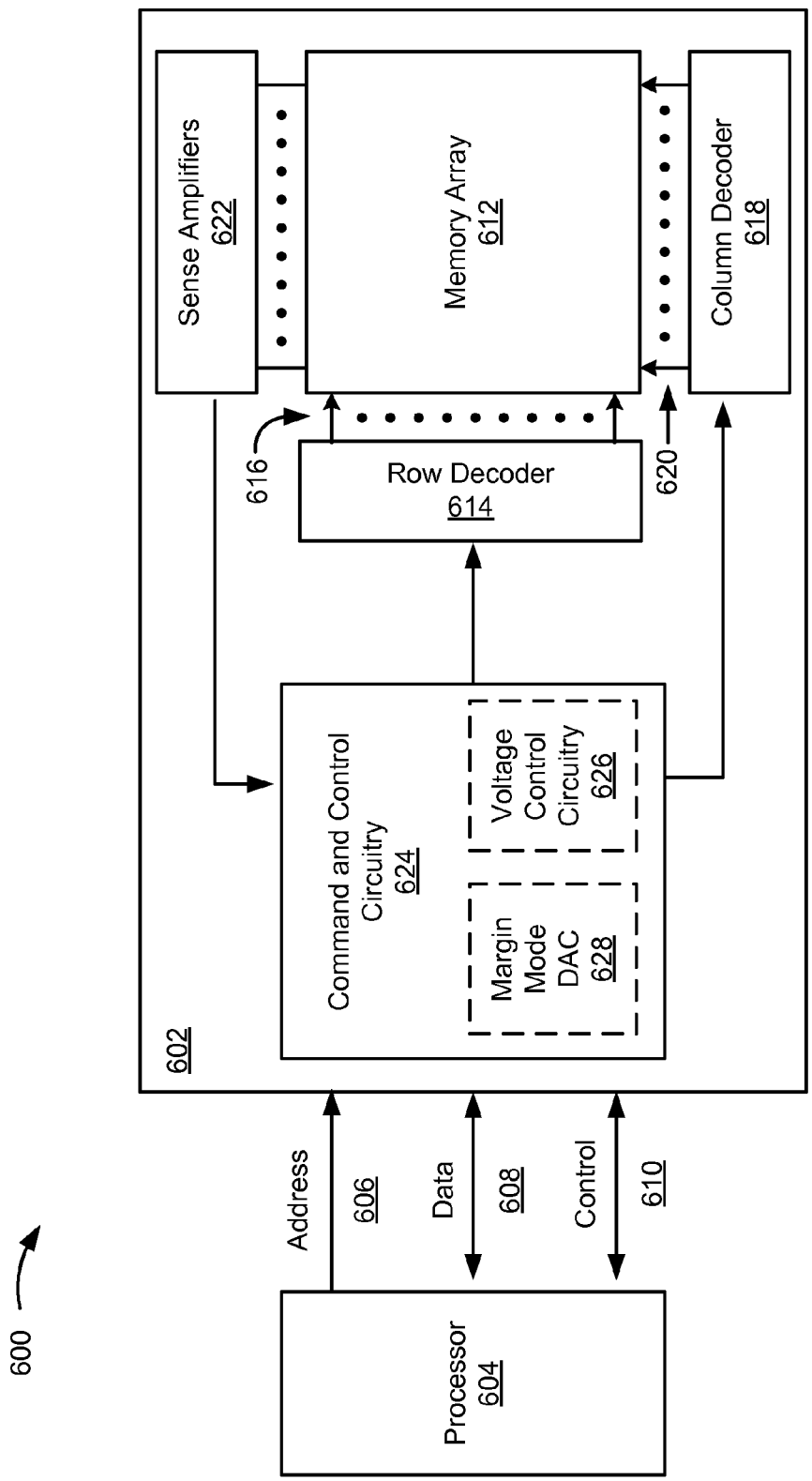
FIG. 6 is a block diagram illustrating a processing system including a memory device according to an embodiment of the present disclosure.

Referring to FIG. 6 the processing system 600 generally includes a non-volatile memory 602 coupled to a processor 604 in a conventional manner via an address bus 606, a data bus 608 and a control bus 610. It will be appreciated by those skilled in the art that the processing system of FIG. 6 has been simplified for the purpose of illustrating the present invention and is not intended to be a complete description. In particular, details of the processor, row and column decoders, sense amplifiers and command and control circuitry, which are known in the art have are not described in detail herein.

The processor 604 may be a type of general purpose or special purpose processing device. For example, in one embodiment the processor can be a processor in a programmable system or controller that further includes a non-volatile memory, such as a Programmable System On a Chip or PSoC™ controller, commercially available from Cypress Semiconductor of San Jose, Calif.

The non-volatile memory 602 includes a memory array 612 organized as rows and columns of non-volatile memory cells (not shown in this figure) as described above. The memory array 612 is coupled to a row decoder 614 via multiple wordlines and read lines 616 (at least one wordline and one read line for each row of the memory array) as described above. The memory array 612 is further coupled to a column decoder 618 via a multiple bitlines and source lines 620 (one each for each column of the memory array) as described above. The memory array 612 is coupled to a plurality of sense amplifiers 622 to read multi-bit words therefrom. The non-volatile memory 602 further includes command and control circuitry 624 to control the row decoder 614, the column decoder 618 and sense amplifiers 622, and to receive read data from sense amplifiers. The command and control circuitry 624 includes voltage control circuitry 626 to generate the voltages needed for operation of the non-volatile memory 602, including $V_{POS}$, $V_{NEG}$ and $V_{INHIB}$, and a margin mode DAC 628 to generate $V_{MARG}$ described above, which is routed through the voltage control circuitry to the row decoder 614. The voltage control circuitry 626 operates to apply appropriate voltages to the memory cells during read, erase and program operations.

The command and control circuitry 624 is configured to control the row decoder 614 to select a first row of the memory array 612 for a program operation by applying a $V_{POS}$ to a first global wordline ($GWL_1$) in the first row and to deselect a second row of the memory array by applying a margin voltage to a second global wordline ($GWL_2$) in the second row. In some embodiments, the command and control circuitry 624 is configured to sequentially couple first $V_{NEG}$ to the second global wordline for a brief period of time and then the margin voltage. As described above, in some embodiments, the start-up time for a margin voltage circuit can be relatively slow as compared to that of $V_{NEG}$ coupled to a substrate node or p-well (SPW) in which the memory transistor is formed, and during this time the voltage bias difference between the deselected wordline ($GWL_2$) and a p-well (SPW) or substrate node can cause erase-state bitline disturb in an unselected memory cell in the first column and second row of the memory array (e.g., cell T3). Thus, to reduce erase-state bitline disturb in the unselected memory cell in the first column and second row of the memory array (e.g., cell T3), $V_{NEG}$ is coupled to the second global wordline ($GWL_2$) in the deselected row for a brief time until a capacitance associated with the deselected wordline(s) is sufficiently precharged, and $V_{NEG}$ has reached a value close to −2.0 volts. The margin voltage is then coupled to the global wordline ($GWL_2$) in the deselected row for the remainder of the program operation to reduce program-state bitline disturb in a second unselected memory cell in the second column and second row of the memory array due to programming of the selected memory cell.

The command and control circuitry 624 is further configured to control the column decoder 618 to select a memory cell in the first row (e.g., cell T1) for programming by applying a $V_{NEG}$ to a first shared bitline ($BL_1$) in a first column, and to inhibit a unselected memory cell in the first row (e.g., cell T2) from programming by applying an inhibit voltage to a second shared bitline ($BL_2$) in a second column. The column decoder 618 may be further configured to apply $V_{NEG}$ to a first shared source line ($SL_1$) in the first column, and to apply the inhibit voltage on a second shared source line ($SL_2$) in the second column.

Details of the command and control circuitry of a memory device according to various embodiments of the present disclosure will now be described with reference to FIGS. 7A-7C.

Figure 7A:
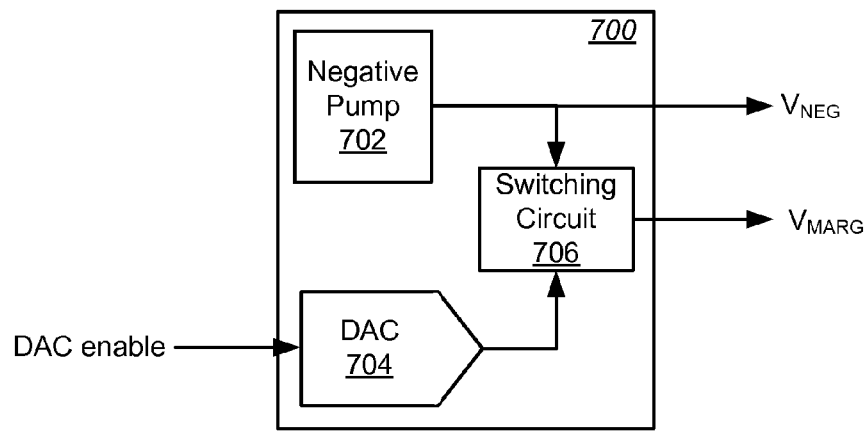
FIGS. 7A-7C are block diagrams illustrating details of command and control circuitry of a non-volatile memory according to various embodiments of the present disclosure.

Referring to FIG. 7A, in one embodiment the command and control circuitry 700 includes a negative HV supply or pump 702 to generate a $V_{NEG}$ coupled to the bitline and source line of the selected cell, and to the substrate nodes during the program operation, a digital-to-analog-converter (DAC 704) enabled by the command and control circuitry to generate a margin voltage to be coupled to the GWLs of deselected rows during the program operation, and a switching circuit 706 to switch between $V_{NEG}$ and the margin voltage coupled to the deselected GWLs during the program operation. The DAC 704 can be a dedicated DAC used solely for generating $V_{MARG}$, or a DAC already included in the command and control circuitry 700 or voltage control circuitry 626 for other purposes, and which is normally not utilized during a program operation. As noted above, in one particular advantageous embodiment the DAC is a margin mode DAC 628 in the command and control circuitry 624 of the non-volatile memory 602, which is used during test to measure the threshold voltages of the non-volatile devices therein, and which is not normally enabled during the program operation. It will be appreciated that adapting such a margin mode DAC for generating $V_{MARG}$ during the program operation requires forming an electrical connection to the switching circuit 706, and through the switching circuit and the row decoder (not shown in this figure) to the GWLs of deselected rows of the memory array during the program operation. The command and control circuitry 624 of the non-volatile memory 602 enables the DAC 704 through a DAC enable signal, and, optionally, operates the DAC to provide a programmed margin voltage level or magnitude. Generally, the DAC 704 is operated to provide a margin voltage having a magnitude less than the voltage magnitude of $V_{NEG}$, i.e., higher or more positive than $V_{NEG}$ in the N-type SONOS embodiment described above, by a voltage equal to at least the threshold voltage ($V_T$) of the of the memory transistor in the memory cell. In other embodiments, the DAC 704 may be programmed or operated to provide a margin voltage magnitude less than $V_{NEG}$ by an amount close to the $V_T$ of the memory transistor. For example, in one embodiment described above the DAC 704 may be programmed or operated to provide a margin voltage adjustable to within one or more small steps of about 14 mV each.

Figure 7B:
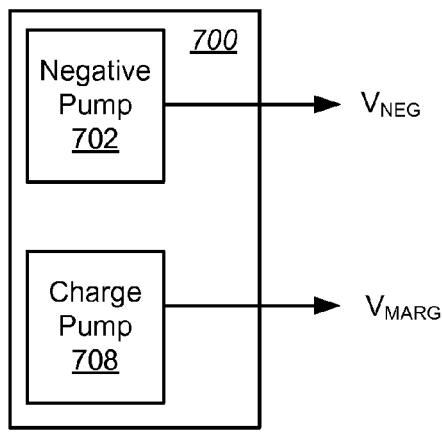

In another embodiment, shown in FIG. 7B, the command and control circuitry 700 includes a second charge pump 708 to generate the margin voltage to be coupled to the GWLs of deselected rows during the program operation. By selecting the second charge pump 708 to have a start-up time and power to charge the capacitance associated with the deselected wordline(s) that are substantially the same as the negative pump 702, the GWLs of the deselected rows can be coupled to the margin voltage throughout the program operation, and thus the need for a separate switching circuit 706 is eliminated.

Figure 7C:
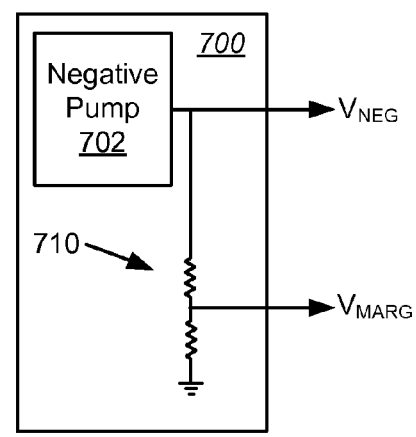

In yet another embodiment, shown in FIG. 7C, the command and control circuitry 700 includes a voltage divider 710 coupled to an output of negative pump 702 to generate the margin voltage to be coupled to the GWLs of deselected rows during the program operation. Because $V_{NEG}$ and $V_{MARG}$ are both supplied by the negative pump 702 there is substantially no difference in start-up time between $V_{NEG}$ and $V_{MARG}$, and the voltage bias difference between $V_{MARG}$ applied the deselected wordline ($GWL_2$) and $V_{NEG}$ applied to the p-well (SPW) or substrate node cannot reach a voltage level sufficient to cause erase-state bitline disturb in the unselected memory cell in the first column and second row of the memory array (e.g., 1.6-1.7 volts for 20-40 µs), the GWLs of the deselected rows can be coupled to the margin voltage throughout the program operation, and thus the need for a separate switching circuit 706 is eliminated.

Figure 8:
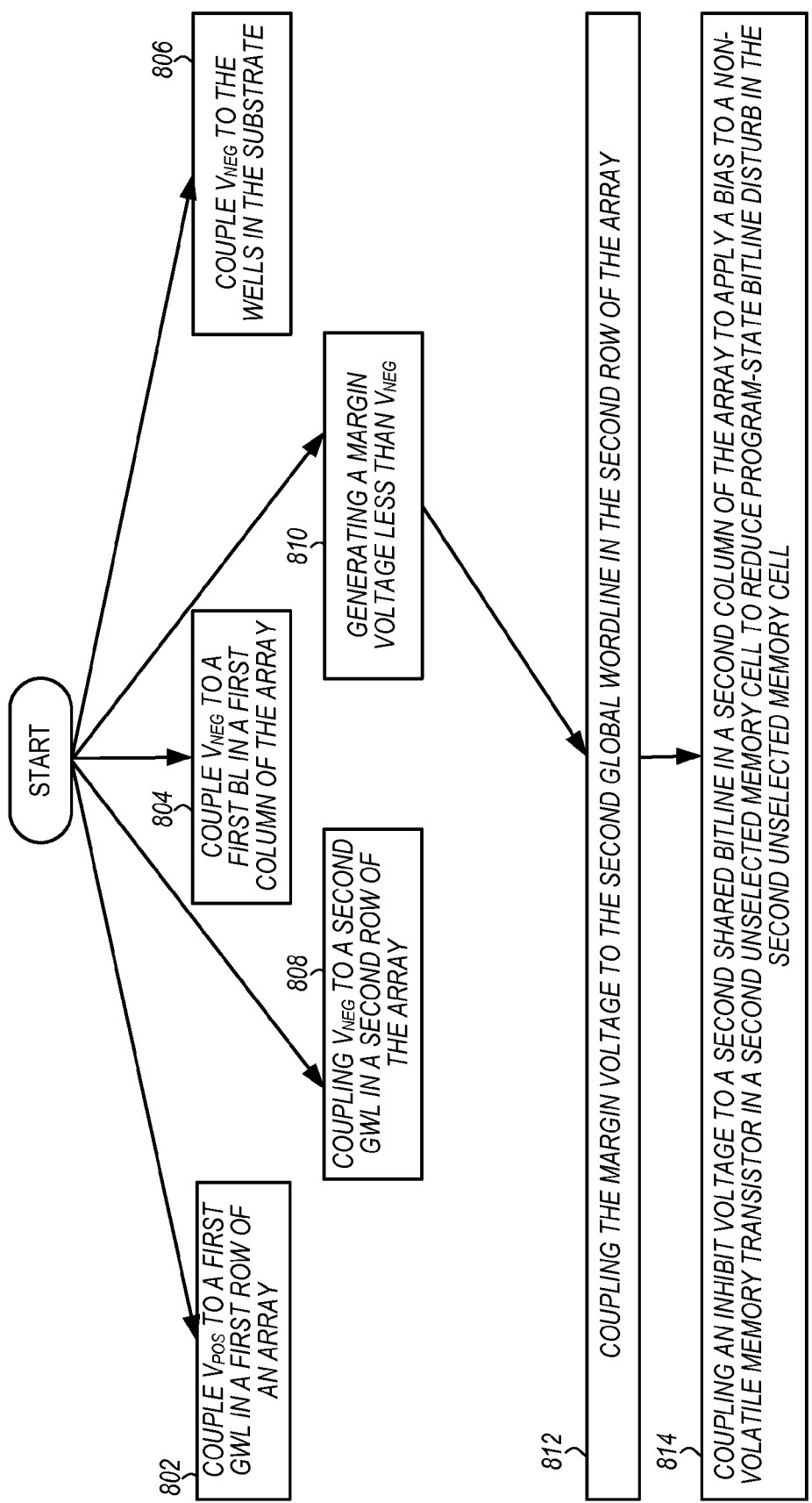
FIG. 8 is a flowchart illustrating a method for reducing bitline disturbs in unselected memory cells according to an embodiment of the present disclosure.

FIG. 8 is a flowchart illustrating a method for reducing program disturb in one embodiment. Note, it will be understood that although all steps of the method are described individually below implying a sequential order that is not necessarily the case, and that as shown in FIG. 8, a first five individual steps of the method are performed at substantially the same time, while a last two steps are performed in order after only a slight delay.

Referring to FIG. 8, a first positive high voltage ($V_{POS}$) is coupled to a first global wordline in a first row of a memory array of memory cells (802). In the next operation, a $V_{NEG}$ is coupled to a first shared bitline in a first column of the memory array to apply a bias to a non-volatile memory transistor in a selected memory cell to program the selected memory cell (804). In embodiments in which the memory transistors are formed in wells in a substrate, the wells may be coupled to electrical ground, a voltage between ground and $V_{NEG}$, or, as in the embodiment shown to $V_{NEG}$ (806). Optionally, $V_{NEG}$ may be coupled to a second global wordline in a second row of the memory array for a brief period of time to apply a bias to a non-volatile memory transistor in a first unselected memory cell in the first column and the second row of the memory array sharing the first shared bitline with the selected memory cell to reduce erase-state bitline disturb in the first unselected memory cell (808). Simultaneously, a margin voltage less than $V_{NEG}$ is generated (810). In the next operation, after only a slight delay the margin voltage is coupled to the second global wordline in the second row of the memory array (812). In the next operation, an inhibit voltage is coupled to a second shared bitline in a second column of the memory array to apply a bias to a non-volatile memory transistor in a second unselected memory cell in the second row and second column to reduce program-state bitline disturb in the second unselected memory cell (814).

Thus, embodiments of a non-volatile memory and methods of operating the same to reduce disturbs have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A method comprising:
coupling a positive voltage to a first global wordline in a first row of a memory array of memory cells and coupling a negative voltage to a first bitline in a first column of the memory array to apply a bias to a non-volatile memory transistor in a selected memory cell to program the selected memory cell; and
coupling a voltage having a magnitude less than the negative voltage to a second global wordline in a second row of the memory array and coupling an inhibit voltage to a second bitline in a second column of the memory array to reduce a bias applied to a non-volatile memory transistor in an un selected memory cell due to the programming of the selected memory cell.

2. The method of claim 1, wherein the magnitude of the voltage coupled to the second global wordline is less than the negative voltage by an amount at least corresponding to a threshold voltage of a transistor associated with the un selected memory cell.

3. The method of claim 1, further comprising:
generating, by a digital-to-analog converter (DAC), the voltage having the magnitude less than the negative voltage.

4. The method of claim 1, further comprising:
at a first time, coupling the negative voltage to the second global wordline in the second row of the memory array, wherein the voltage having a magnitude less than the negative voltage is coupled to the second global wordline at a second time.

5. The method of claim 4, wherein the second time corresponds to when a digital-to-analog converter has generated the voltage having the magnitude less than the negative voltage.

6. The method of claim 1, wherein the voltage having the magnitude less than the negative voltage is coupled to the second global wordline for a duration of the programming of the selected memory cell.

7. The method of claim 1, further comprising:
generating, by a charge pump, the voltage having the magnitude less than the negative voltage.

8. A method comprising:
applying a positive voltage to a first global wordline in a row of a memory array of memory cells and a negative voltage to a first bitline in a column of the memory array to apply a bias to a non-volatile memory transistor in a selected memory cell to program the selected memory cell; and
applying a voltage having a magnitude less than the negative voltage to a second global wordline in a second row of the memory array and an inhibit voltage to a second bitline in a second column of the memory array to reduce a bias applied to a non-volatile memory transistor in an un selected memory cell that is associated with the programming of the selected memory cell.

9. The method of claim 8, wherein the magnitude of the voltage applied to the second global wordline is less than the negative voltage by an amount at least corresponding to a threshold voltage of a transistor associated with the un selected memory cell.

10. The method of claim 8, further comprising:
generating, by a digital-to-analog converter (DAC), the voltage having the magnitude less than the negative voltage.

11. The method of claim 8, further comprising:
at a first time, applying the negative voltage to the second global wordline in the second row of the memory array, wherein the voltage having a magnitude less than the negative voltage is applied to the second global wordline at a second time.

12. The method of claim 11, wherein the second time corresponds to when a digital-to-analog converter has generated the voltage having the magnitude less than the negative voltage.

13. The method of claim 8, wherein the voltage having the magnitude less than the negative voltage is applied to the second global wordline for a duration of the programming of the selected memory cell.

14. The method of claim 8, further comprising:
generating, by a charge pump, the voltage having the magnitude less than the negative voltage.

15. A method comprising:
coupling a first global wordline to a memory array of memory cells, wherein the first global wordline is associated with a first row of the memory array of memory cells;
coupling a first bitline to the memory array of memory cells, wherein the first bitline is associated with a first column of the memory array of memory cells, and wherein the first global wordline is to be coupled with a positive voltage and the first bitline is to be coupled with a negative voltage to apply a bias to a non-volatile memory transistor in a selected memory cell to program the selected memory cell;
coupling a second global wordline to the memory array of memory cells, wherein the second global wordline is associated with a second row of the memory array of memory cells; and
coupling a second bitline to the memory array of memory cells, wherein the second bitline is associated with a second column of the memory array of memory cells, and wherein the second global wordline is to be coupled with a voltage having a magnitude less than the negative voltage and the second bitline is to be coupled to an inhibit voltage to reduce a bias applied to a non-volatile memory transistor in an un selected memory cell due to the programming of the selected memory cell.

16. The method of claim 15, wherein the magnitude of the voltage coupled to the second global wordline is less than the negative voltage by an amount at least corresponding to a threshold voltage of a transistor associated with the un selected memory cell.

17. The method of claim 15, further comprising:
generating, by a digital-to-analog converter (DAC), the voltage having the magnitude less than the negative voltage.

18. The method of claim 15, further comprising:
at a first time, coupling the negative voltage to the second global wordline associated with the second row of the memory array,
wherein the voltage having a magnitude less than the negative voltage is coupled to the second global wordline at a second time.

19. The method of claim 18, wherein the second time corresponds to when a digital-to-analog converter has generated the voltage having the magnitude less than the negative voltage.

20. The method of claim 15, wherein the voltage having the magnitude less than the negative voltage is coupled to the second global wordline for a duration of the programming of the selected memory cell.

* * * * *